(12) United States Patent
Luo et al.

(10) Patent No.: US 7,542,489 B2
(45) Date of Patent: Jun. 2, 2009

(54) INJECTION SEEDING EMPLOYING CONTINUOUS WAVELENGTH SWEEPING FOR MASTER-SLAVE RESONANCE

(75) Inventors: Ningyi Luo, Fremont, CA (US);
Sheng-Bai Zhu, Fremont, CA (US);
Minzheng Wo, Fremont, CA (US);
Shaoping Lu, Palo Alto, CA (US)

(73) Assignee: Pavilion Integration Corporation, San Jose, CA (US)

( * ) Notice: Subject to any disclaimer, the term of this patent is extended or adjusted under 35 U.S.C. 154(b) by 539 days.

(21) Appl. No.: 11/170,911

(22) Filed: Jun. 29, 2005

(65) Prior Publication Data

US 2006/0215714 A1    Sep. 28, 2006

Related U.S. Application Data

(60) Provisional application No. 60/665,175, filed on Mar. 25, 2005.

(51) Int. Cl.
*H01S 3/098* (2006.01)
(52) U.S. Cl. .......................................... 372/18; 372/19
(58) Field of Classification Search .................. 372/18, 372/19, 25, 28, 29.02
See application file for complete search history.

(56) References Cited

U.S. PATENT DOCUMENTS 4,752,931 A * 6/1988 Dutcher et al. ................. 372/18
5,974,060 A * 10/1999 Byren et al. ................... 372/19
6,016,323 A    1/2000 Kafka et al.

OTHER PUBLICATIONS

U.S. Appl. No. 60/665,175, Luo, Zhu.
U.S. Appl. No. 11/052,725, Luo, Zhu, Lu, Zhou.
U.S. Appl. No. 60/676,619, Luo, Zhu.

* cited by examiner

*Primary Examiner*—Armando Rodriguez

(57) ABSTRACT

A method for effective injection seeding is based on continuous wavelength sweeping for matching the injected seeds with one or more longitudinal mode(s) of the slave oscillator in every pump pulse. This is achieved through rapidly varying laser drive current resulted from RF modulation. Depending on the modulation parameters, the seed may be operated at quasi-CW or pulsed mode, with a narrow or broad bandwidth, for injection seeding of single longitudinal mode or multimode. The wavelength and bandwidth of the laser output can be tuned according to the needs. From pulse to pulse, the master-slave resonance may occur at different wavelengths upon cavity length fluctuations. Cavity length control via complicated feedback devices and phase locking schemes are consequently not required. The present invention also encompasses an injection seeded solid-state laser constructed in accordance with the inventive method and a novel application of RF modulated laser diode to spectral purification and producing high power Gaussian beam with narrow pulse width in a stable, reliable, and cost-effective manner.

18 Claims, 9 Drawing Sheets

FIG 4
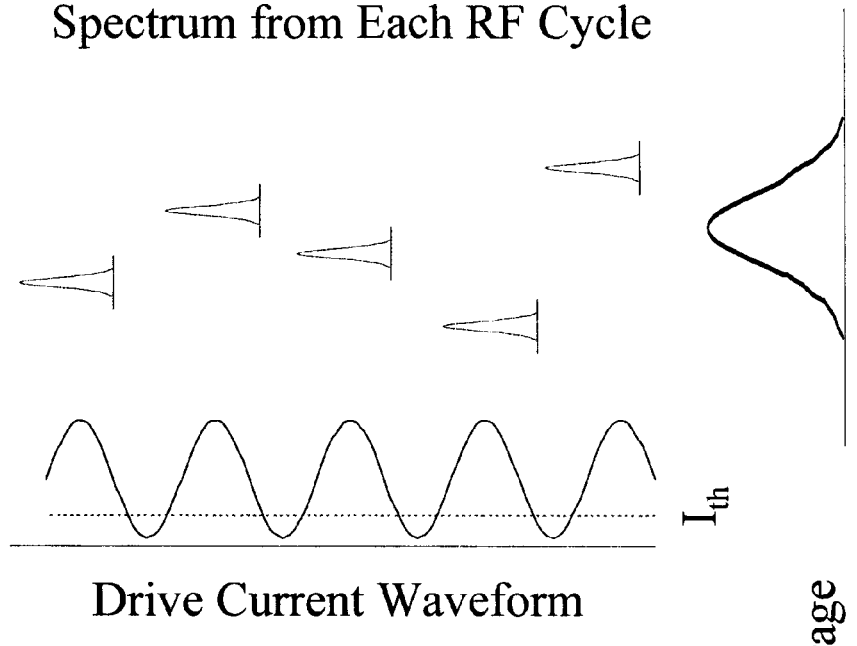
Spectrum from Each RF Cycle
Drive Current Waveform
Time Average
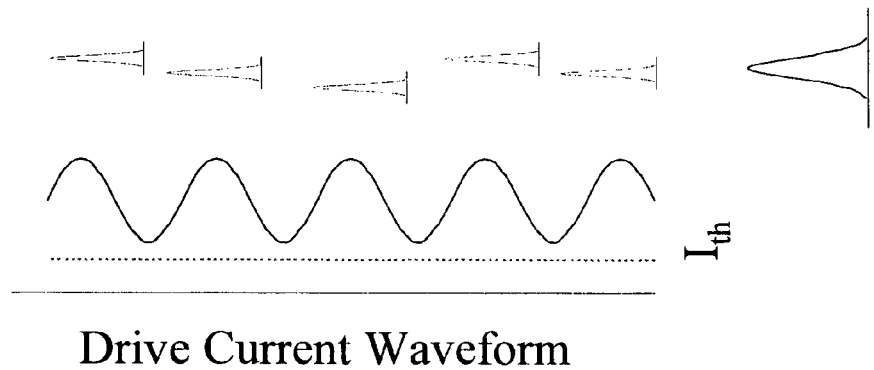
Spectrum from Each RF Cycle
Drive Current Waveform

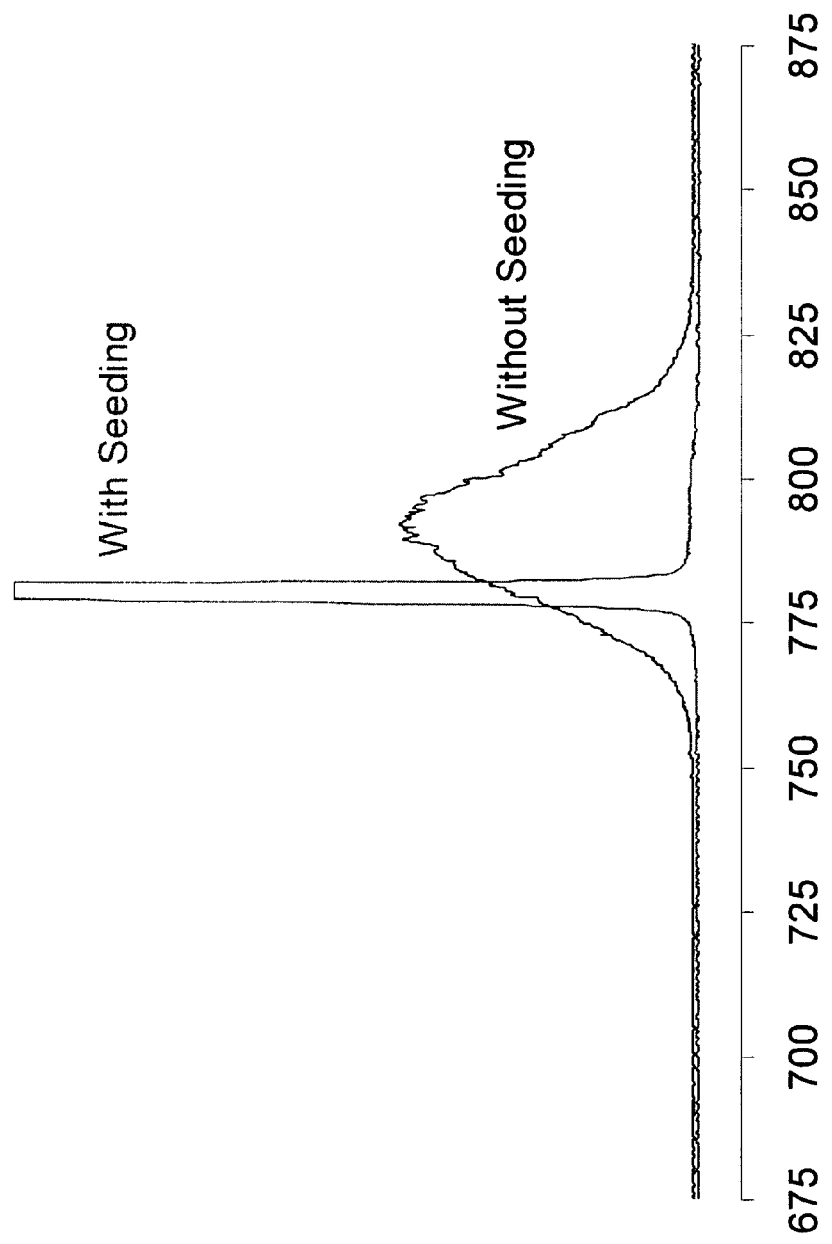

INJECTION SEEDING EMPLOYING CONTINUOUS WAVELENGTH SWEEPING FOR MASTER-SLAVE RESONANCE

CROSS REFERENCE TO RELATED APPLICATION

This application claims the benefit of U.S. Provisional Application No. 60/665175, filed Mar. 25, 2005, which is hereby incorporated by reference in its entirety.

FIELD OF THE INVENTION

This invention relates in general to injection-seeded solid-state lasers, in particular to injection-seeded solid-state lasers employing continuous wavelength sweeping for master-slave resonance, and more particularly, to replacement of stringent cavity length control and phase locking with continuous wavelength sweeping accomplished through a radio frequency (RF) modulated seed source for effective injection seeding.

BACKGROUND OF THE INVENTION

Many applications require compact coherent sources of radiation with extensive tuning ranges and high efficiencies. Injection seeding is a technology commonly employed to fulfill such requirements. By controlling the spectral properties of a power oscillator, referred to as slave, with an external low power output laser, referred to as seeder, the system efficiency and reliability can be improved while practical problems associated with high power lasers such as nonuniform pump profiles and thermally induced optical distortions or damages can be eliminated or reduced.

Single longitudinal mode (SLM) injection seeding has long been demonstrated as an effective approach to generating narrow linewidth of high power radiation and, in particular, to ensuring single transverse and longitudinal mode of either gain-switched or Q-switched operation. In conventional SLM injection seeding, a diode pumped solid-state (DPSS) monolithic ring laser or an external cavity diode laser or a fiber laser is employed as a seeder. In contrast with standing-wave cavities, ring lasers have the beam circulating in a loop, which eliminates problems such as spatial hole burning. The cavity length of the slave oscillator must be actively controlled to resonate at the injected frequency within the tolerance. Lasing will occur only in the desired longitudinal mode because the buildup time from the seed beam is much faster than any other unseeded modes that must build up from random noise photons.

SLM seeders can be operated at CW or pulsed mode. CW seeding is most commonly used because it eliminates the needs for timing between the seeder and the pump laser. SLM seed sources are normally based on short cavities to increase intermode spacing and require careful control of cavity length and/or using intra-cavity or extra-cavity etalons or gratings or other wavelength selective elements to filter out a desired single mode seed beam. Continuous tunability often relies on feedback control of the seeder cavity length, the crystal angles, and tuning mirrors covering a broad range of wavelengths. They are complicated and are limited to a small number of wavelengths. In addition, the seeds are generally too weak to produce high power single mode outputs.

One approach to producing high power single longitudinal mode outputs is based on multimode injection seeding. In U.S. Pat. No. 6,016,323, Kafka, et al. claimed an oscillator system, which produced a broadly tunable single longitudinal mode output from a multimode seed source and a short cavity resonator. Multimode seeders do not require cavity length control, however, the seeding may not be stable and the slave laser may suffer from mode hopping.

While some applications prefer laser emission on a single longitudinal mode, there exist other applications for which high optical quality beams, short temporal coherence length, high power output, and stable operation of multiple modes are desirable. Examples include laser optical scanning systems, optical memory devices, laser raster printing systems, laser display systems, inspection systems, lithographic systems, imaging instrumentation, and other applications where speckle reduction is necessary. In U.S. Pat. No. 5,974,060, Byren, et al. demonstrated a laser oscillator for simultaneously producing a number of widely separated longitudinal modes from a short cavity seeder. The optical length of the slave resonator cavity was adjusted to be an integer multiple of the optical length of the seed laser cavity. Although the resonant effect substantially reduces the threshold of seeding power, it requires a stringent and active control of the resonator cavity length to be resonant with the seed wavelength. Resonator length change may be a result of vibration or temperature variation, causing mode hop in a random manner. In a stable resonator, oscillation is generally limited to the fundamental, single transverse mode, $TEM_{00}$, with a highly uniform intensity profile across it. However, the controlled size of the laser beam within the oscillator is very small, which limits the output power.

Alternatively, injection seeding can be operated under non-resonant conditions, e.g., detuning between the seed frequency and the slave cavity resonance, short slave cavity terminated by a weak reflector and/or non-resonant modulation, i.e. significant detuning of the round-trip period in the slave cavity from the seeder RF modulation period and its harmonics. For example, Rafailov, et al. demonstrated a tunable single mode operation from non-resonant self-injection seeding (IEEE Quantum Electronics 7, 2001) as well as a dual-wavelength (Applied Physics Letters 80, 2002) or multiple-wavelength (Applied Physics Letters 85, 2004) laser output from non-resonantly injection-seeded diode lasers.

In spite of these successes, the prior arts typically require complex and costly systems such as those employed for cavity length control and/or phase locking in order to synchronize pulse timing between the seed and seeded lasers. There is a need for compact, robust, reliable, efficient, and low-cost laser sources capable of generating wavelength-purified, stable and short-duration pulses with high power $TEM_{00}$ output and low optical noise.

SUMMARY OF THE INVENTION

It is therefore an object of the present invention to provide for a compact, robust, reliable, efficient, and low-cost laser source for spectral purification and stabilization and capable of generating stable $TEM_{00}$ output and low optical noise.

Viewed from a first aspect, our invention employs continuous wavelength sweeping for master-slave resonance. In particular, the injected photons repeatedly sweep over a range covering one or more longitudinal modes of the slave oscillator, which eliminates the needs for complicated cavity length control and phase locking.

Viewed from a second aspect, continuous wavelength sweeping is accomplished through periodic variation of the seed laser drive current, in particular, through a radio frequency (RF) modulated seed source, which can be pulsed or quasi-CW. Due to the high frequency modulation, wavelength sweeping is rapid and essentially continuous.

Viewed from a third aspect, the modulation degree, frequency, and duty cycle can vary, depending on specific applications. At any instant in time, the seed beam is narrowband. As the drive current changes, the wavelength sweeps. From cycle to cycle, the central wavelength dithers. If the modulation is so deep that the drive current periodically passes through the threshold, the seed laser rebuilds the oscillation at one or more randomly selected modes at an extremely high rate. When averaged over time, the injection seeding is broadband and multimode. Therefore, the present invention can be applied to injection seeded lasers for producing single longitudinal mode or multiple longitudinal mode outputs.

Viewed from a fourth aspect, seed source can be an RF modulated laser diode or other light sources producing stable laser output with rapidly varying wavelength over a range covering one or more longitudinal modes of the slave oscillator.

Viewed from a fifth aspect, precise timing between the seeder and the pump pulse is not required, if the injection seeding is quasi-CW or pulsed at a high repetition rate and/or high duty cycle. Pump sources can be selected from the group including laser diodes, diode pumped solid-state lasers with or without wavelength conversion, light emitting diode (LED) arrays, and vertical cavity surface emitting laser (VCSEL) arrays.

Viewed from a sixth aspect, the injection seed locked spectrum can be stabilized at different wavelength and the bandwidth can vary to meet the requirements and preference for various applications.

Viewed from a seventh aspect, the present invention enables laser output of good beam quality (Gaussian profile) and large beam size in an ordinary short Fabry-Perot cavity. Optical noise associated with mode hop, mode partitioning, and/or interference between coherent lights can be greatly reduced.

The advantages and novel features of this invention will be more obvious from the detailed description below.

BRIEF DESCRIPTION OF THE DRAWINGS

FIG. 4 is a graphic illustration of the wavelength sweeping mechanism according to the present invention;

FIG. 6C displays output spectra of the short cavity solid-state laser shown in FIG. 6A, with or without injection seeding.

DETAILED DESCRIPTION OF THE PRESENT INVENTION

As will be described in more detail hereafter, there is disclosed herein an injection-seeded solid-state laser employing continuous wavelength sweeping for master-slave resonance.

Figure 1:
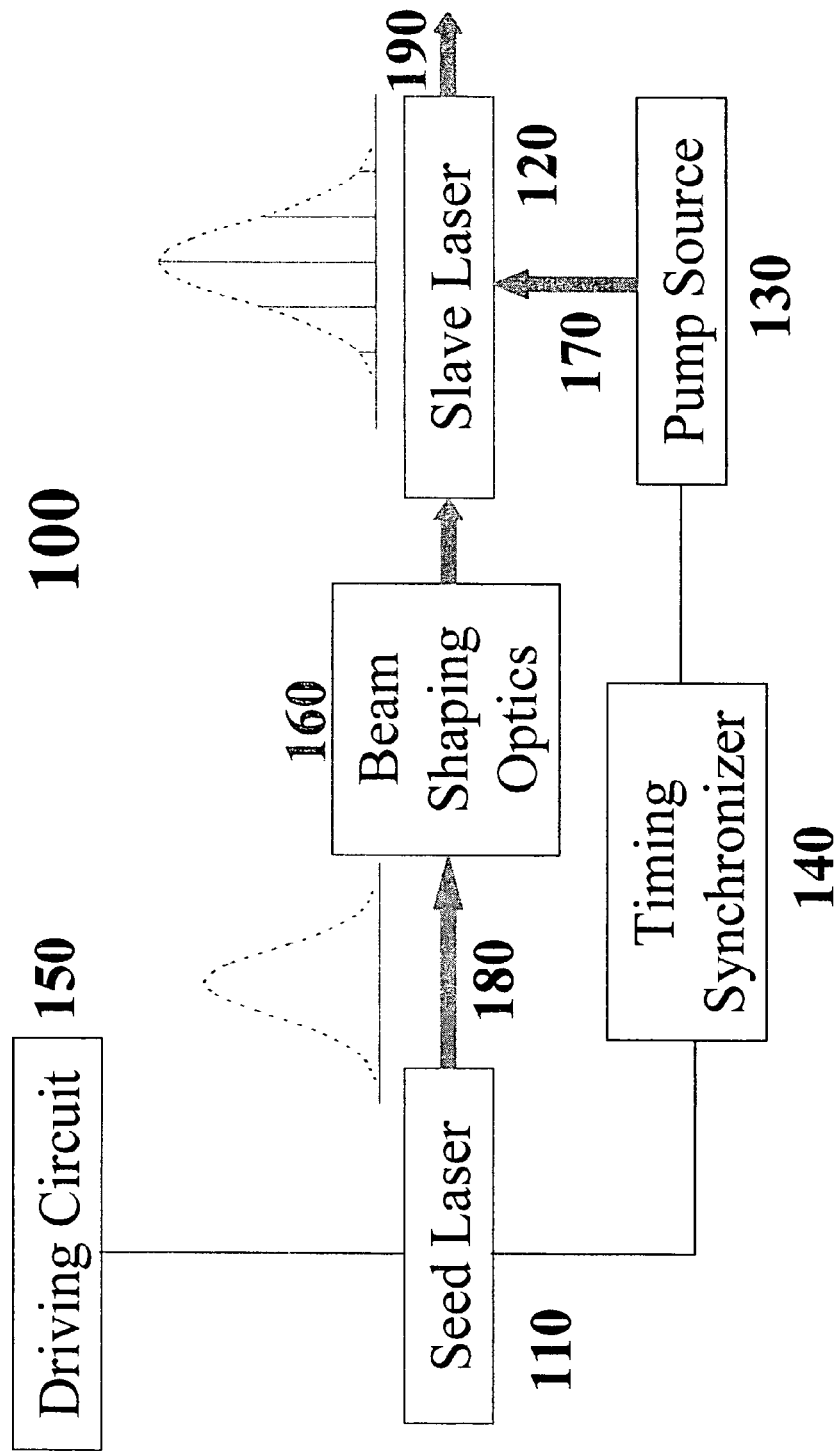
FIG. 1 is a block diagram of master-slave laser configuration according to the present invention.

Referring to drawings and in particular to FIG. 1, wherein a conceptual illustration of a master-slave laser constructed according to the present invention is given in form of block diagram. In particular, the master-slave laser system 100 is composed of a seed laser 110, a solid-state slave laser 120, a pump source 130, and an optional timing synchronizer 140.

Advantageously, the seed laser 110 is a laser diode, which is energized by an RF modulated driving circuit 150. As the drive current varies, the wavelength of the light 180 emitted from the seed laser 110 changes and results in a continuous wavelength profile. For example, 1 mA current change or 0.1 K temperature change will cause 2.8 GHz frequency shift of an AlGaAs laser. Through the beam shaping optics 160, the light 180 is injected into the slave laser 120, as seeds. As can be appreciated by those skilled in the art, the seed laser is not restricted to laser diode. It can be other light sources producing continuous wavelength sweeping over a range covering one or more longitudinal modes of the slave laser.

On the other hand, the solid-state slave laser 120 is energized by pulsed light 170 emitted from the pump source 130. For effective seeding, the seeds 180 should be injected into 120 on or before arrival of the pump pulse 130, although in some cases, the seeds may be introduced somewhat after the gain become positive. If the injection seeding beam is quasi-CW or pulsed at a high repetition rate and/or high duty cycle, timing synchronization is not required. Preferably, the seeding pulse frequency is an integer multiple of the pump frequency. As an advantage of the present invention, these conditions can be easily satisfied by appropriate selection of the operation parameters.

The pump source 130 can be laser diode, diode pumped solid-state lasers with or without harmonic frequency conversion or frequency mixing, LED arrays or VCSEL arrays. Employing LED or VCSEL arrays as optical pump sources was described in U.S. patent application Ser. No. 11/052725, entitled "Solid-State Lasers Employing Incoherent Monochromatic Pump" and in U.S. Provisional Application No. 60/676,619, entitled "Vertical Cavity Surface Emitting Laser (VCSEL) Arrays Pumped Solid-State Lasers".

Depending on the number of longitudinal modes covered by the seed wavelength profile, the laser output from the slave 120 can be multimode or single mode. In addition, the purified spectrum can be stabilized at different wavelength and the bandwidth can vary to meet the requirements and preference for various applications.

Figure 2:
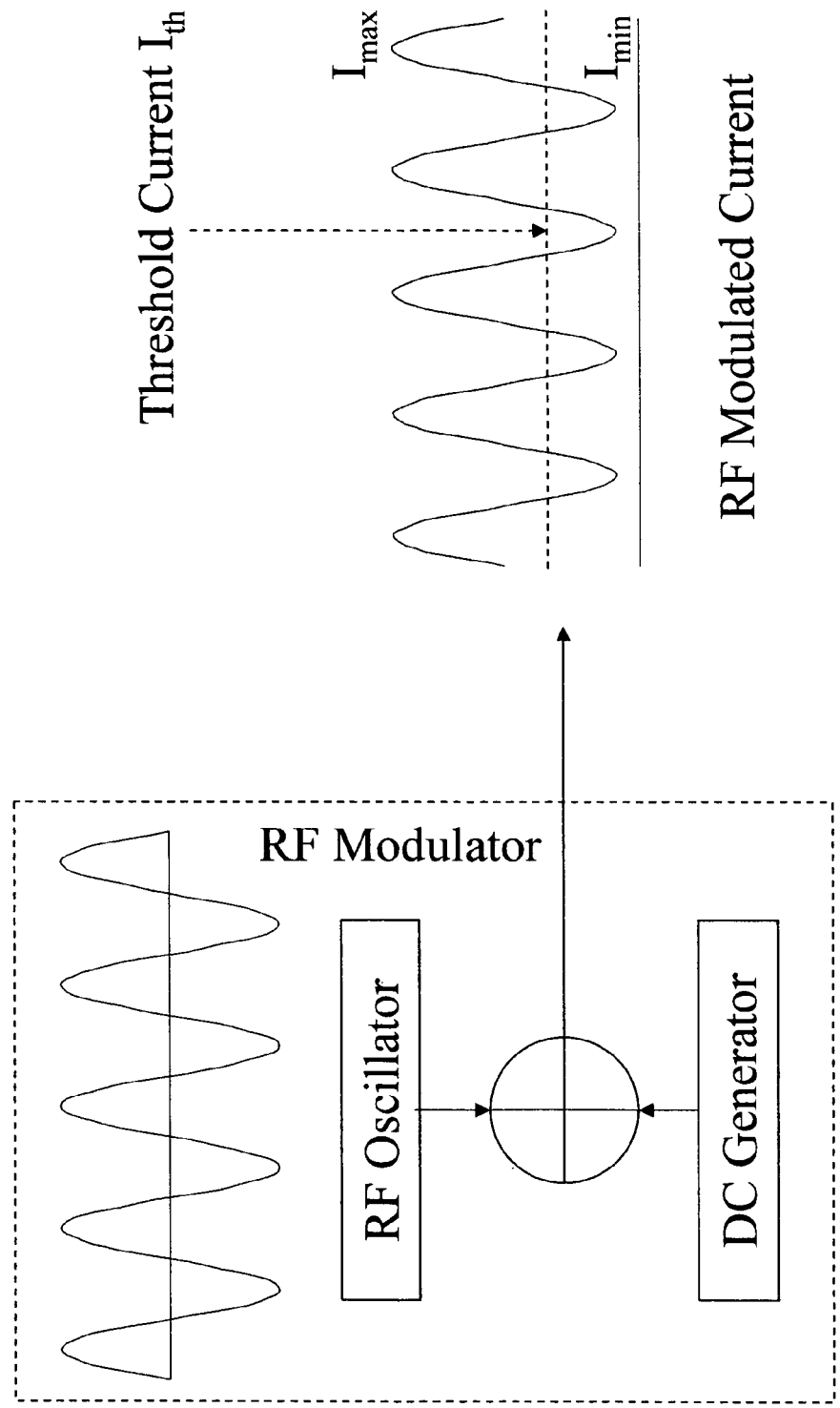
FIG. 2 shows RF modulation mechanism and drive current waveform.

A schematic illustration of RF modulation mechanism is given in FIG. 2. As shown in this graph, the RF modulator comprises a DC generator and an RF oscillator. Superimposition of the RF signal to the DC bias results in the drive current. Although the waveform shown in FIG. 2 is a sine function, it can be other periodic functions, preferably with a high duty cycle. RF modulation has been applied to stabilization of laser diode operation and noise reduction. The present invention claims a new application, in particular, an application for cost-effective injection seeding, both multimode and single mode, with broad or narrow bandwidth.

Parameters for RF modulation include frequency, duty cycle, and depth. The depth or degree of modulation can be defined as $M_d=(I_{th}-I_{min})/(I_{max}-I_{min})$, where $I_{th}$ denotes the threshold, $I_{max}$ and $I_{min}$ are, respectively, the maximum and minimum values of the drive current. For negative $M_d$, i.e., $I_{th}<I_{min}$, the seeder operates at quasi-CW mode and emits light all the time. As $M_d$ becomes positive, the seeder generates a package of photons in pulsed mode and due to repeated on-off operation the laser oscillation restarts each cycle at randomly selected modes. The pulse width depends on the modulation degree, frequency, and duty cycle. According to our inventive teachings, changing the modulation degree can be realized by varying the amplitude of the RF signal, the frequency is tunable by adjusting the LC parameters, and the duty cycle can be optimized by selecting the RF waveform. As will become clearer from the following descriptions, our invention is advantageous to adjustable modulation degree, frequency, and duty cycle to meet different requirements for various applications.

Figure 3A:
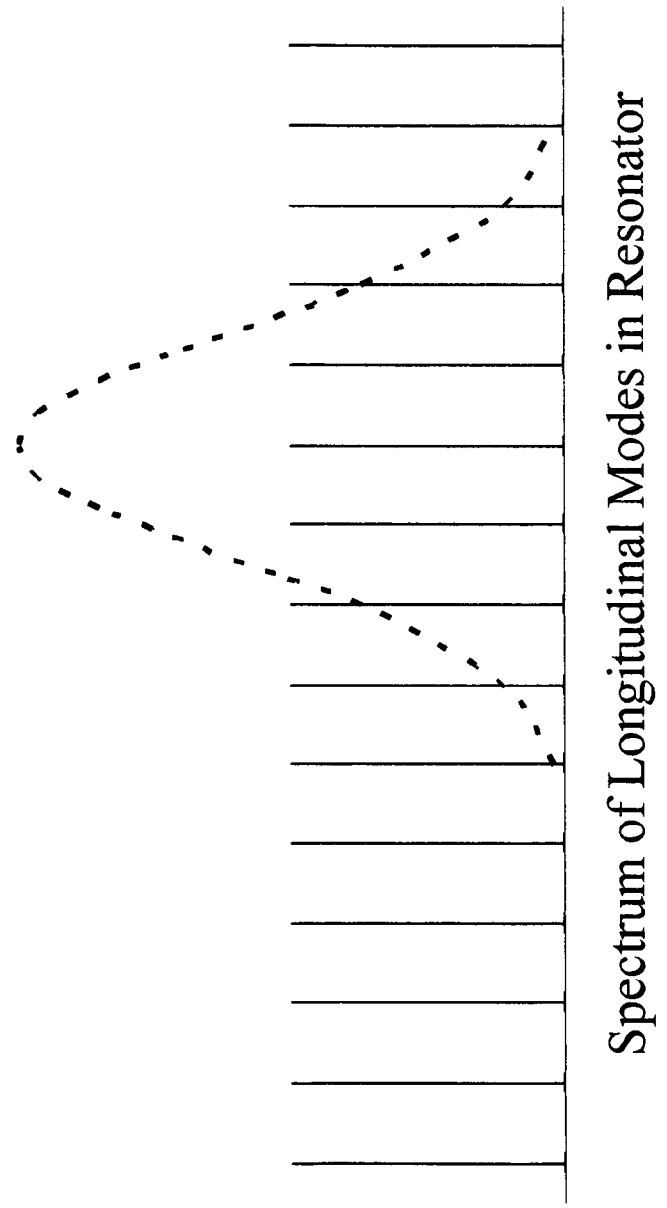
FIG. 3A is a graphic illustration of the inventive wavelength sweeping scheme for multimode laser output.
Figure 3B:
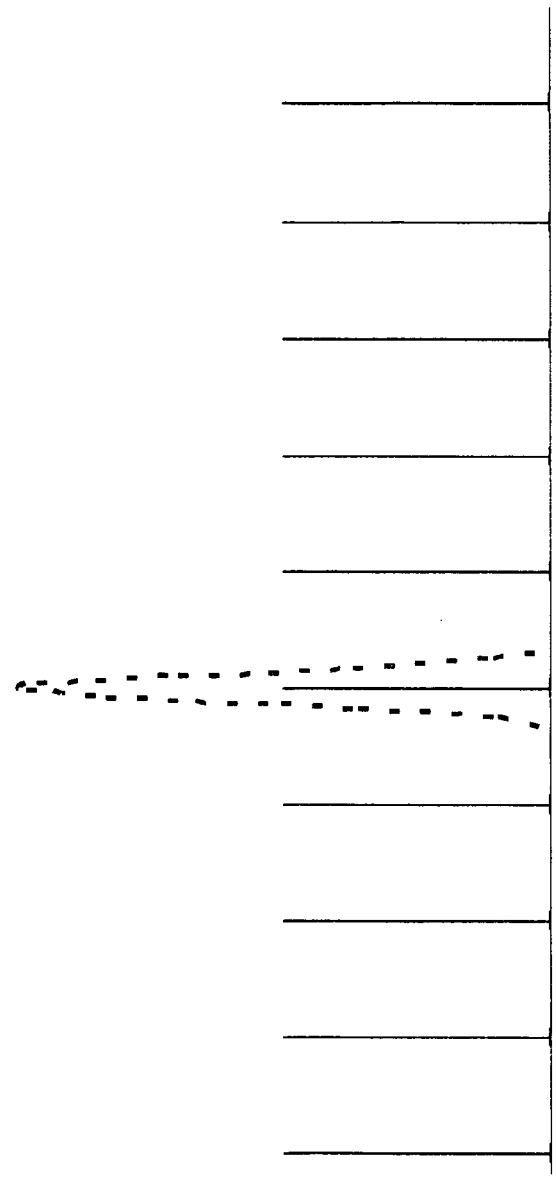
FIG. 3B is a graphic illustration of the inventive wavelength sweeping scheme for single mode laser output.

With reference now to FIGS. 3A and 3B, wherein a scheme based on continuous wavelength sweeping for matching the injected seeds with one or more longitudinal modes of the slave oscillator is shown. In sharp contrast to the prior art employing complex cavity length stabilization or feedback control and phase locking schemes, the present invention achieves the master-slave resonance through intentional variation of the seed wavelength rather than the slave mode.

For the application illustrated in FIG. 3A, a sweeping range wide enough to cover a plurality of longitudinal modes is guaranteed by the use of an RF modulator, which periodically turns on and off the laser diode to force the seeder operating at multimode with a broad bandwidth. A related method for realizing tuning between the injected seeds and the longitudinal modes through shunt modulation was disclosed in U.S. Provisional Application No. 60/665175, entitled "Shunt Modulator Stabilized Laser Diodes and Diode-Pumped Solid-State Lasers".

On the other hand, if the sweeping range is narrower than the mode interval, but is wider than the mode uncertainty induced by random change of the cavity length due to temperature and/or vibration, single mode laser output can be obtained without implementation of the complicated cavity length control and mode selection mechanisms. Such conditions can be met by appropriate selection of the RF modulation parameters and the slave cavity optical length. For short cavity slaves, single longitudinal mode can be obtained even from broadband injection seeding with multiple modes. FIG. 3B shows the inventive wavelength sweeping scheme corresponding to SLM injection seeding.

Conventional wavelength swept lasers employ wavelength tuning or filtering elements to make continuous change of laser output wavelength from a broadband optical emission. In sharp contrast to the prior art, the present invention accomplishes wavelength sweeping based on laser drive current variations at high speed. A graphic illustration of the inventive wavelength sweeping mechanism is given in FIG. 4. As the drive current periodically changes at RF rate, the laser output has continuously varying wavelength. At any instant in time, the seed beam is narrowband. Each RF cycle corresponds to a wavelength sweeping, normally covering a narrow bandwidth, and the central wavelength dithers from one cycle to another. Averaged over time, the bandwidth is broadened.

If the modulation is not deep enough to completely turn off the laser, as shown in the left part of FIG. 4, the laser operates at a quasi-CW mode and the central wavelength of each sweeping spectrum fluctuates over a narrow range, merely due to dithering. Accordingly, the time-averaged sweeping spectrum has a relatively narrow bandwidth. If the bandwidth $\Delta v < c/2L$, where c is the speed of light and L is the optical length of the slave resonator, but $\Delta v > c\Delta L/2L^2$, where $\Delta L$ is the largest cavity length variation due to the environmental and/or operational conditions, SLM injection seeding can be achieved through an one-time adjustment for overlapping the time-averaged sweeping spectrum with the desired longitudinal mode of the slave oscillator. This process can be accomplished by, e.g., temperature tuning of a laser diode as the seeding source.

Broadband injection seeding requires a deep modulation to periodically turn off the laser when the drive current drops below the threshold and rebuild oscillation at one or more modes at random as the drive current exceeds the threshold again. Since the fresh start normally takes place at different modes, the central wavelength of each sweeping spectrum jumps around, over one or more mode intervals, leading to a broadband time average and covering plural longitudinal modes, as shown in the right part of FIG. 4. Since the on-off operation takes place at an RF repetition rate, a rapid and continuous wavelength sweeping is achieved. Such configuration is particularly useful for multimode injection seeding.

Figure 5:
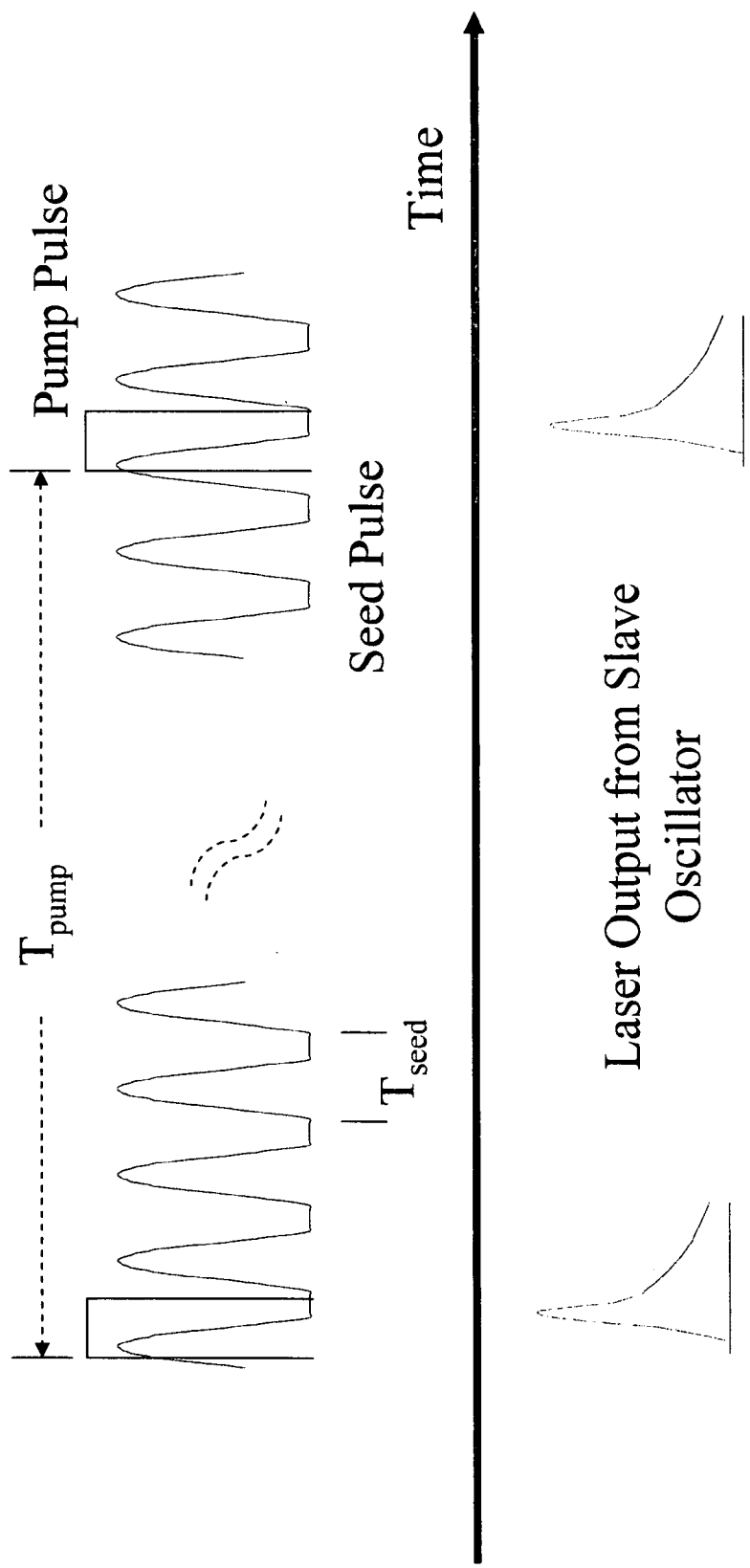
FIG. 5 displays waveforms of injected seeds, pump pulses, and laser output from slave oscillator in time domain.

Temporal overlap between the injected seeds and the gain profile of the slave can be satisfied without precise timing synchronization, providing that the injection seeding is quasi-CW or pulsed with high repetition rate and/or high duty cycle. Displayed in FIG. 5 are waveforms of the injection seeding and pump pulses in time domain. For seed pulses with high repetition rates and/or high duty cycles, as shown in this FIG. 5, the leading edge of any pump pulse, at least in part, is guaranteed to fall into the seed waveform so that gain is built up only with seeded modes. Timing synchronization is not required in these cases. Preferably, though not necessarily in many cases, the seeding frequency is an integer multiple of the pumping frequency, $T_{pump} = nT_{seed}$, where n is an integer, $T_{pump}$ and $T_{seed}$ are, respectively, the repetition periods of the pump pulse and seed pulse. Also shown in this graph is temporal shape of laser output from the slave oscillator. With injection seeding, the pulse buildup time is shortened. On the other hand, the pulse tail is a function of the cavity life time and decreases as the cavity length shortens. For short cavity slave oscillators, a narrow pulse width can be achieved.

Figure 6A:
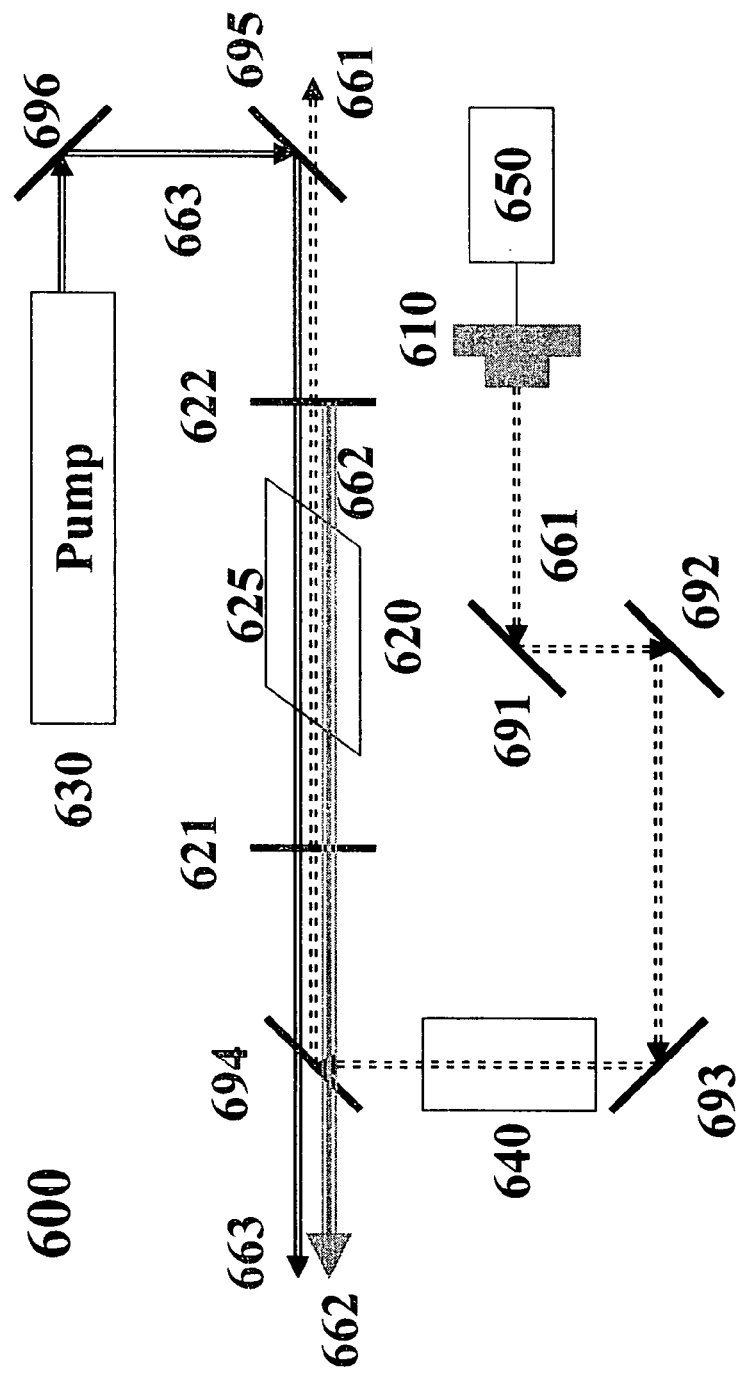
FIG. 6A is a schematic graph of a short cavity solid-state laser, in conjunction with a seed laser constructed in accordance with the present invention.

As can be appreciated by those skilled in the art, our inventive teachings are of particular merit for seeding tunable, solid-state lasers such as Ti:Sapphire laser, which has a broad gain bandwidth and tuning range. As shown in FIG. 6A, an injection-seeded pulsed laser 600 comprises a seeder 610 energized by drive circuit 650, a gain medium 625 placed between a pair of mirrors 621 and 622, a pump source 630, and an isolator 640, which can be a combination of a Faraday rotator and a polarizer for isolating the seeder from the slave oscillator.

In particular, the gain medium 625 can be Ti:Sipphire crystal, which, together with a short Fabry-Perot cavity composed of the mirrors 621 and 622, form a slave oscillator 620. With a short cavity, the pulse tail is shortened, which enables producing extremely narrow pulses. Challenges for short cavity and short pump pulse operations include $TEM_{00}$ mode control, wavelength and spectral bandwidth control, and timing jitter or pulse repetition frequency variation caused by random fluctuation in the effective cavity length. These issues are addressed in the present invention and, in particular, are discussed in details on the basis of the exemplary configuration shown in FIG. 6A.

As is well known, Titanium Sapphire crystals possess a broad vibronic fluorescence band, which allows tunable laser output between 670-1070 nm, with the peak of the gain curve around 790 nm. In addition, this material exhibits a broad absorption band, located in the blue-green region of the visible spectrum with a peak around 490 nm. Accordingly, the pump source 630 displayed in FIG. 6A can be a frequency doubled Nd:YAG or Nd:YLF laser or other light sources such as LED arrays.

Titanium Sapphire lasers are typically operated at gain-switched pulse mode because of the short fluorescence lifetime, around 3.2 μs at the room temperature, which results in a high threshold. Accordingly, the pump source 630 also operates at a pulsed mode, preferably has a duration of 3.2 µs or shorter.

On the other hand, the seeder 610, which, in this particular system, is a laser diode emitting light around 785 nm and is modulated by a sine wave with frequency of approximately 240 MHz. Due to the RF modulation, the seeder injects a series of photons 661 with wavelengths continuously sweeping over a range covering one or more longitudinal modes of the slave oscillator 620. Upon arrival of the pump pulse, lasing is rapidly built up at the mode that matches the seeded photons.

Figure 6B:
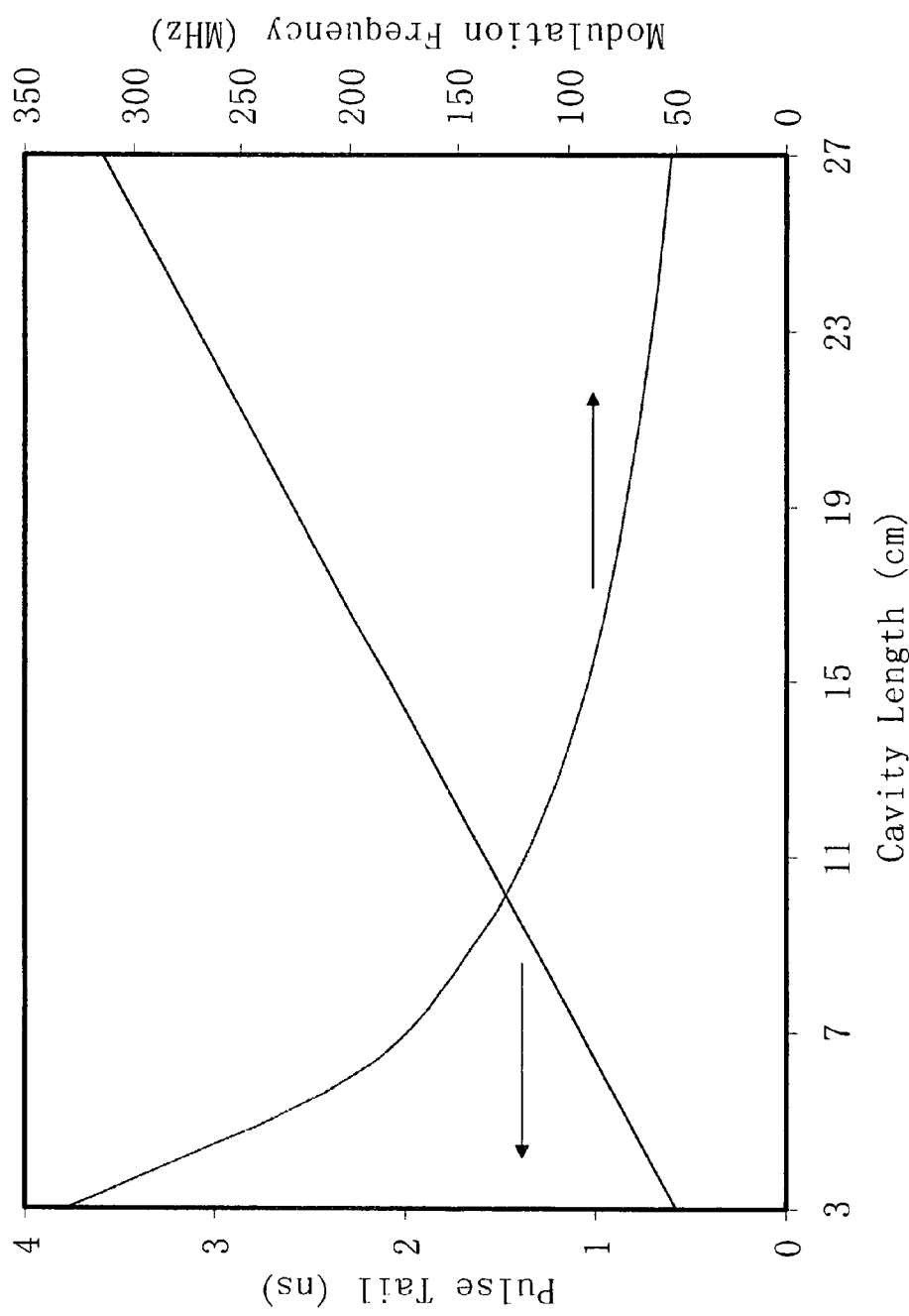
FIG. 6B displays pulse tail duration as a function of the cavity optical length for the configuration shown in FIG. 6A.

Laser output of nanosecond pulse width with stable $TEM_{00}$ mode can be obtained in an ultra short cavity. For example and with reference to FIG. 6B, wherein there is shown a linear relationship between the pulse tail duration and the cavity optical length, assuming the length of the Ti:Sipphire crystal to be a constant and equal 20 mm. Provided that the drive current modulation frequency is so chosen that the seeding pulse is short in comparison with the round trip time interval, these pulses will not interfere with each other and the resonance effects disappear. For reference, the critical drive current modulation frequency, defined as the reciprocal of the round trip time of photons in the slave cavity, is also shown in FIG. 6B. It should be mentioned that the curves displayed in FIG. 6B is only for illustration of the exemplary system shown in FIG. 6A.

FIG. 6C displays the laser output spectra for a Ti:Sapphire laser configured as shown in FIG. 6A. For this particular system, the degree of RF modulation is not deep enough to completely turn off the laser operation, so that the seeds are stable quasi-CW. As a result, synchronization of pulse timing between the seed laser 610 and the pump source 630 is not required. As evidenced by referring to FIG. 6C, the injection seeding, although without complex cavity length stabilization, phase locking, and timing synchronization is effective and indeed purifies the laser output spectrum. As an advantage of the present invention, the purified spectrum can be stabilized at different laser wavelength and the linewidth can vary, depending on the selective operation parameters, to meet the requirements and preference of various applications.

It should be pointed out that our inventive teachings are not limited to Ti:Sapphire lasers. Various solid-state laser systems including tunable lasers such as Alaxandrite and Cr:L-iSAF lasers, CW or pulsed, SLM or multimode, with or without Q-switch, in slave cavities of length from ultra short to long, can be effectively injection-seeded by employing our inventive wavelength sweeping scheme.

What is claimed is:

1. A method for effective injection seeding of an optical oscillator, called slave oscillator, which is not associated with any modifications and additional adaptations for stabilization of the optical cavity length, comprising steps of:
generating optical seeds from a laser emitter, called seeder or master, with continuously swept wavelengths repetitive in an RF rate;
injecting the optical seeds into the slave oscillator along its longitudinal direction; and
achieving master-slave resonance while the cavity length of the slave oscillator is allowed to be randomly fluctuating with time;
wherein:
said wavelength sweeping covers one or more longitudinal mode(s) of the slave oscillator; and
said longitudinal modes of the slave oscillator can vary randomly as the cavity length fluctuates.

2. A method as of claim 1 wherein the seeder is an electrically excited laser driven by a drive current, further comprising steps of:
periodical change of the laser drive current to generate wavelength-swept optical seeds.

3. A method as of claim 2 further comprising steps of:
generating the drive current by superimposition of an RF signal to a DC bias.

4. A method as of claim 1 wherein the seeder is a semiconductor laser operating at a temperature called operation temperature, further comprising steps of:
adjusting the operation temperature of the seeder.

5. A method as of claim 1 further comprising steps of:
energizing an optical pump source to optically pump the slave oscillator such that substantial population inversion is achieved in the gain medium.

6. A method as of claim 5 further comprising steps of:
generating optical pump pulse from the optical pump source, wherein the pulse width matches with the fluorescence lifetime of the gain medium disposed within the slave oscillator.

7. An injection seeding laser system comprising:
a laser emitter that produces optical seeds with continuously swept wavelengths repetitive in a radio frequency rate, as the seeder;
a slave laser that receives the injected optical seeds and is controlled by these seeds further consisting of a gain medium and an optical resonator cavity not associated with any modifications and additional adaptations for stabilization of the optical cavity length;
a pump source for exciting said gain medium;
an isolator for isolating seeder from slave laser output; and
optical elements for effectively injecting the optical seeds into the slave laser cavity along its longitudinal direction such that the optical seeds spatially overlap the gain region of the slave oscillator.

8. An injection seeding laser system as of claim 7, wherein:
said resonator cavity is composed of two plane-parallel mirrors as an ordinary Fabry-Perot resonator.

9. An injection seeding laser system as of claim 7, wherein:
said gain medium is selected from solid-state laser materials including glasses, oxides, phosphates, silicates, tungstates, molybdates, vanadates, beryllates, fluorides, and ceramics, doped with active ions including rare earth ions, actinide ions, transition metals; in particular, vibronic materials including Titanium Sapphire, Alexandrite, Chromium doped LISAF, and similar.

10. An injection seeding laser system as of claim 7 wherein the seeder is a semiconductor laser, further comprising a temperature controller for setting and controlling the operation temperature of the seed laser.

11. An injection seeding laser system as of claim 7 further comprising
one or more nonlinear optical crystal(s) for converting the frequency of the slave laser output.

12. An injection seeding laser system as of claim 7 wherein:
said pump source is one or more LED arrays or VCSEL arrays.

13. An injection seeding laser system comprising:
a laser diode energized by a radio frequency modulated drive current, as the seeder, to emit wavelength-swept optical seeds;
a slave laser that receives the injected optical seeds and is controlled by these seeds, further consisting of a gain medium and an optical resonator cavity not associated with any modifications and additional adaptations for stabilization of the optical cavity length;

a pump source for exciting said gain medium;

an isolator for isolating seeder from slave laser output; and optical elements for effectively injecting the optical seeds into the slave laser cavity along its longitudinal direction such that the optical seeds spatially overlap the gain region of the slave oscillator; wherein:

said radio frequency modulated drive current is generated by a circuit composed of a DC generator to generate DC bias, an RF generator to generate RF signal, and a summing junction for superimposing the DC bias and the RF signal;

such that the DC bias is controlled by an automatic power control system based on feedback signal;

the RF signal is selected from any one of the followings: a sine wave, a distorted sine wave, a rectified since wave, or other periodic waves;

whereby:

the degree of RF modulation is variable by adjusting the amplitude of the RF signal;

the frequency of RF modulation is variable by adjusting the repetition rate of the periodic wave.

14. An injection seeding laser system as of claim 13 wherein:

said resonator cavity is composed of two plane-parallel mirrors as an ordinary Fabry-Perot resonator.

15. An injection seeding laser system as of claim 13, wherein:

said gain medium is selected from solid-state laser materials including glasses, oxides, phosphates, silicates, tungstates, molybdates, vanadates, beryllates, fluorides, and ceramics, doped with active ions including rare earth ions, actinide ions, transition metals; in particular, vibronic materials including Titanium Sapphire, Alexandrite, Chromium doped LISAF, and similar.

16. An injection seeding laser system as of claim 13 further comprising:

a temperature controller setting at a temperature where the seed laser operates.

17. An injection seeding laser system as of claim 13 further comprising one or more nonlinear optical crystal(s) for converting the frequency of the slave laser output.

18. An injection seeding laser system as of claim 13 wherein:

said pump source is one or more LED arrays or VCSEL arrays.

* * * * *